United States Patent
Richter et al.

(10) Patent No.: US 8,450,172 B2
(45) Date of Patent: May 28, 2013

(54) NON-INSULATING STRESSED MATERIAL LAYERS IN A CONTACT LEVEL OF SEMICONDUCTOR DEVICES

(75) Inventors: Ralf Richter, Dresden (DE); Hartmut Ruelke, Dresden (DE); Joerg Hohage, Dresden (DE)

(73) Assignee: GLOBALFOUNDRIES Inc., Grand Cayman (KY)

(*) Notice: Subject to any disclaimer, the term of this patent is extended or adjusted under 35 U.S.C. 154(b) by 213 days.

(21) Appl. No.: 12/823,660

(22) Filed: Jun. 25, 2010

(65) Prior Publication Data
US 2010/0327362 A1    Dec. 30, 2010

(30) Foreign Application Priority Data
Jun. 30, 2009   (DE) .................. 10 2009 031 156

(51) Int. Cl.
*H01L 21/8238* (2006.01)
*H01L 21/4763* (2006.01)
*H01L 21/44* (2006.01)

(52) U.S. Cl.
USPC .... 438/233; 438/637; 438/666; 257/E21.305; 257/E21.297; 257/E21.585

(58) Field of Classification Search
USPC .............. 438/199, 233, 666; 257/E21.305, 257/E21.297
See application file for complete search history.

(56) References Cited

U.S. PATENT DOCUMENTS

| | | | |
|---|---|---|---|
| 2003/0181005 A1* | 9/2003 | Hachimine et al. | 438/231 |
| 2005/0199958 A1 | 9/2005 | Chen et al. | 257/368 |
| 2005/0236694 A1 | 10/2005 | Wu et al. | 257/632 |
| 2007/0117371 A1* | 5/2007 | Engbrecht et al. | 438/622 |
| 2007/0200179 A1* | 8/2007 | Chen | 257/369 |
| 2008/0083955 A1* | 4/2008 | Kanarsky et al. | 257/382 |
| 2008/0242015 A1* | 10/2008 | Lee et al. | 438/200 |
| 2008/0303068 A1 | 12/2008 | Grill et al. | 257/288 |

OTHER PUBLICATIONS

Translation of Official Communication from German Patent Office for German Patent Application No. 10 2009 031 156.4 dated May 3, 2010.

* cited by examiner

*Primary Examiner* — Daniel Luke
(74) *Attorney, Agent, or Firm* — Williams, Morgan & Amerson, P.C.

(57) ABSTRACT

In sophisticated semiconductor devices, non-insulating materials with extremely high internal stress level may be used in the contact level in order to enhance performance of circuit elements, such as field effect transistors, wherein the non-insulating material may be appropriately "encapsulated" by dielectric material. Consequently, a desired high strain level may be obtained on the basis of a reduced layer thickness, while still providing the insulating characteristics required in the contact level.

18 Claims, 7 Drawing Sheets

NON-INSULATING STRESSED MATERIAL LAYERS IN A CONTACT LEVEL OF SEMICONDUCTOR DEVICES

BACKGROUND OF THE INVENTION

1. Field of the Invention

Generally, the present disclosure relates to the field of integrated circuits, and, more particularly, to circuit elements, such as field effect transistors, and manufacturing techniques based on strain-inducing mechanisms using stressed material layers formed in the contact level.

2. Description of the Related Art

Integrated circuits typically include a large number of circuit elements located on a given chip area according to a specified circuit layout, wherein, in complex circuits, the field effect transistor represents one predominant circuit element. Generally, a plurality of process technologies for advanced semiconductor devices are currently practiced, wherein, for complex circuitry based on field effect transistors, such as microprocessors, storage chips, graphic devices and the like, MOS technology is currently one of the most promising approaches due to the superior characteristics in view of operating speed and/or power consumption and/or cost efficiency. During the fabrication of complex integrated circuits using MOS technology, millions of transistors, i.e., N-channel transistors and/or P-channel transistors, are formed on a substrate including a crystalline semiconductor layer. A field effect transistor, irrespective of whether an N-channel transistor or a P-channel transistor is considered, comprises so-called PN junctions that are formed by an interface of highly doped drain and source regions with an inversely or weakly doped channel region disposed between the drain region and the source region. The conductivity of the channel region, i.e., the drive current capability of the conductive channel, is controlled by a gate electrode formed adjacent to the channel region and separated therefrom by a thin insulating layer. The conductivity of the channel region, upon formation of a conductive channel due to the application of an appropriate control voltage to the gate electrode, depends on the dopant concentration, the mobility of the charge carriers and, for a given extension of the channel region in the transistor width direction, on the distance between the source and drain regions, which is also referred to as channel length. Hence, the conductivity of the channel region substantially determines the performance of MOS transistors. Thus, the reduction of the channel length, and associated therewith the reduction of the channel resistivity, may be a dominant design criterion for accomplishing an increase in the operating speed of the integrated circuits.

The shrinkage of the transistor dimensions, however, involves a plurality of issues associated therewith that have to be addressed so as to not unduly offset the advantages obtained by steadily decreasing the channel length of MOS transistors. One issue associated with reduced gate lengths is the occurrence of so-called short channel effects, which may result in a reduced controllability of the channel conductivity. Short channel effects may be countered by certain design techniques, some of which, however, may be accompanied by a reduction of the channel conductivity, thereby partially offsetting the advantages obtained by the reduction of critical dimensions.

In view of this situation, it has been proposed to enhance device performance of the transistor elements not only by reducing the transistor dimensions but also by increasing the charge carrier mobility in the channel region for a given channel length, thereby increasing the drive current capability and thus transistor performance. In this manner, performance of sophisticated logic circuitry may be enhanced, for instance, in a microprocessor, performance per watt of consumed power may be increased. For example, the lattice structure in the channel region may be modified, for instance, by creating tensile or compressive strain therein, which results in a modified mobility for electrons and holes, respectively. For example, creating tensile strain in the channel region of a silicon layer having a standard crystallographic configuration may increase the mobility of electrons, which in turn may directly translate into a corresponding increase of the conductivity of N-type transistors. On the other hand, compressive strain in the channel region may increase the mobility of holes, thereby providing the potential for enhancing the performance of P-type transistors.

One efficient approach in this respect is a technique that enables the creation of desired stress conditions within the channel region of transistor elements by adjusting the stress characteristics of a dielectric layer stack that is formed above the basic transistor structure when the contact level of the device is formed. The contact level, comprised of an interlayer dielectric material and contact elements, may be understood as an interface between the individual semiconductor circuit elements and a complex wiring system or metallization system, in which metal lines and vias may provide the complex network of electrical connections. The dielectric layer stack of the contact level typically comprises one or more dielectric layers which may be located close to the transistor and which may also be used in controlling a respective etch process in order to form contact openings connecting to the gate and drain and source terminals. Therefore, an effective control of mechanical stress in the channel regions, i.e., an effective stress engineering, may be accomplished by adjusting the internal stress of one or more of these layers, which may also be referred to as contact etch stop layers, and by positioning a contact etch stop layer having an internal compressive stress above a P-channel transistor and/or by positioning a contact etch stop layer having an internal tensile strain above an N-channel transistor, thereby creating compressive and tensile strain, respectively, in the respective channel regions.

Typically, the contact etch stop layer is formed by plasma enhanced chemical vapor deposition (PECVD) processes above the transistor, i.e., above the gate structure and the drain and source regions, wherein, for instance, silicon nitride may be efficiently used due to its high etch selectivity with respect to silicon dioxide, which is a well-established interlayer dielectric material. Furthermore, PECVD silicon nitride may be deposited with a high intrinsic stress, for example, up to 3.6 Giga Pascal (GPa) of compressive stress and up to 1.6 GPa of tensile stress, wherein the type and the magnitude of the intrinsic stress may be efficiently adjusted by selecting appropriate deposition parameters. For example, ion bombardment, deposition pressure, substrate temperature, gas flow rates and the like represent respective parameters that may be controlled for obtaining the desired intrinsic stress.

The resulting strain level in the channel regions of the adjacent transistor elements is determined by the internal stress level of the dielectric materials, the amount of the stressed dielectric material and the effective offset from the channel region. Consequently, for a given device geometry, the strain level in the channel region is typically increased by increasing the internal stress level of the dielectric materials and also increasing the layer thickness of the dielectric materials. During the ongoing scaling of sophisticated semiconductor devices, however, the layer thickness of the stressed dielectric material is limited by the deposition capabilities of the PECVD techniques and the resulting sophisticated surface topography caused by the gate electrode structures of the transistor elements, in particular when densely packed device regions are considered. Furthermore, in some conventional approaches, a so-called "dual stress liner" approach may be applied in which a compressively stressed dielectric material is positioned above the P-channel transistor while a tensile stressed dielectric material is formed above the N-channel transistor, thereby requiring sophisticated masking and patterning regimes, which may also require a reduced layer thickness in order to avoid deposition and patterning related irregularities, such as voids, undue material residues and the like. Consequently, a further increase of transistor performance may critically depend on the internal stress levels of the dielectric materials.

FIG. 1 schematically illustrates a cross-sectional view of a conventional semiconductor device 100 which may comprise a substrate 101 and a silicon-based semiconductor layer 102 formed above the substrate 101. In the semiconductor layer 102, an isolation structure 102C laterally delineates active regions 102A, 102B of corresponding transistors 150A, 150B. Thus, the active regions 102A, 102B comprise drain and source regions 153 and a channel region 154, the conductivity of which is to be increased by inducing an appropriate strain component 154S, which may be a compressive strain component, as for instance shown for the transistor 150A, while the component 154S may represent a tensile strain, as illustrated for the transistor 150B. Furthermore, metal silicide regions 155 are typically formed in the drain and source regions 153 so as to provide appropriate contact regions for contact elements to be formed in a contact level 160 in a later manufacturing stage, thereby reducing the overall contact resistivity, which may also contribute to superior performance of the semiconductor device 100. The transistors 150A, 150B further comprise a gate electrode structure 151, which may have any appropriate configuration, i.e., a gate dielectric material 151A in combination with an electrode material 151B is provided in accordance with the overall device requirements. Furthermore, typically, a sidewall spacer structure 152 is formed on sidewalls of the gate electrode structure 151.

The transistor elements 150A, 150B of the semiconductor device 100 may be formed on the basis of any appropriate process strategy in accordance with the design rules, which may determine critical geometric and electrical parameters of the transistors 150A, 150B. For example, a gate length, i.e., in FIG. 1, the horizontal extension of the electrode material 151B, may be 50 nm and less in sophisticated applications. After completing the basic configuration of the transistors 150A, 150B, the contact level is provided, for instance, by depositing appropriate dielectric materials, such as a dielectric layer 161 and a further dielectric material 162, wherein these materials may be provided in the form of a silicon nitride material in combination with a silicon oxide material and the like. Upon forming the contact level 160, the dielectric material 161 may be deposited, possibly in combination with additional etch stop and liner materials (not shown), so as to have a high internal stress level in order to obtain the desired strain component 154S at least for one of the transistors 150A, 150B. To this end, well-established plasma enhanced deposition recipes are applied wherein, however, the maximum internal stress level may be restricted to the above-specified value ranges unless significant deposition related irregularities may be induced during the deposition procedure. In addition, the thickness of the layer 161 is restricted by the resulting device geometry, thereby requiring a layer thickness of approximately 100 nm and less in sophisticated semiconductor devices. Furthermore, in dual stress liner approaches the material 161 may be provided in the form of two individually deposited material layer systems with different internal stress levels, thereby requiring even further reduced thickness values of the individual silicon nitride layers in order to avoid deposition and patterning related irregularities, which may finally result in contact failures. Hence, although the internal stress level of the dielectric material 161 may provide an efficient performance enhancing mechanism for the transistors 150A, 150B upon device scaling, the performance gain may be restricted or may even be reduced due to a requirement of reduced thickness values and the non-availability of deposition recipes for silicon nitride materials having an internal stress level that is higher than specified above.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure provides semiconductor devices and techniques in which materials may be used in the contact level of sophisticated semiconductor devices which may have increased internal stress levels such that, for a given layer thickness, a significantly increased strain component may be induced in corresponding semiconductor regions, while in other cases a significantly reduced layer thickness may be applied for a given desired strain level in the semiconductor regions. It has been recognized that a plurality of materials may be deposited with high internal stress levels of approximately 4 GPa and significantly higher, wherein, however, these materials may have a certain degree of conductivity and may thus be considered as non-insulating materials. According to the principles disclosed herein, the non-desired conductivity of these materials may appropriately be taken into consideration upon forming a contact level of semiconductor devices so as to enable a deposition of the highly stressed material in close proximity to the relevant semiconductor areas, such as channel regions of field effect transistors, while nevertheless providing the required overall insulating behavior of the contact level. To this end, the non-insulating strain-inducing material may be appropriately "encapsulated" by dielectric materials so as to avoid direct contact to contact regions of the semiconductor regions and also to corresponding contact elements that may connect to the semiconductor region under consideration.

One illustrative semiconductor device disclosed herein comprises a circuit element formed in and above a semiconductor region, wherein the circuit element comprises a contact region. Moreover, the semiconductor device comprises an interlayer material formed above the semiconductor region and comprising a strain-inducing non-insulating material layer and a dielectric material, wherein the strain-inducing non-insulating material layer induces a strain in the semiconductor region. Furthermore, the semiconductor device comprises a contact element extending through the interlayer material and connecting to the contact region.

One illustrative method disclosed herein comprises forming a first dielectric layer above a semiconductor region that comprises a contact region. The method further comprises forming a non-insulating strain-inducing material layer above the first dielectric layer and forming a second dielectric layer above the non-insulating strain-inducing material layer. Furthermore, the method comprises forming a contact opening so as to extend from the second dielectric layer to the contact region, wherein the contact opening is laterally separated from the non-insulating strain-inducing material layer. Additionally, the contact opening is filled with a conductive material.

A further illustrative method disclosed herein comprises forming a non-insulating strain-inducing material layer above a semiconductor region of a semiconductor device so as to be electrically insulated from the semiconductor region, wherein the non-insulating strain-inducing material layer induces strain in the semiconductor region. The method further comprises forming a dielectric material above the non-insulating strain-inducing material layer. Additionally, the method comprises forming a contact element through the non-insulating strain-inducing material layer and the dielectric material such that the contact element is electrically insulated from the non-insulating strain-inducing material layer.

BRIEF DESCRIPTION OF THE DRAWINGS

The disclosure may be understood by reference to the following description taken in conjunction with the accompanying drawings, in which like reference numerals identify like elements, and in which.

Figure 1:
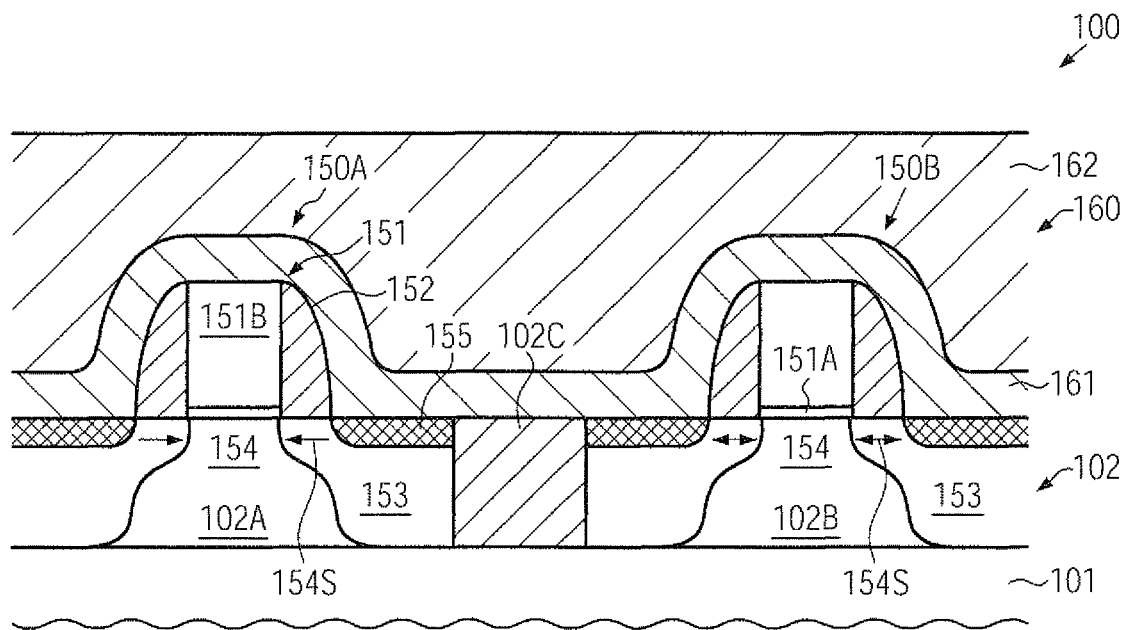
FIG. 1 schematically illustrates a cross-sectional view of a conventional semiconductor device in which a strain-inducing dielectric material is provided in the contact level.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

According to the principles disclosed herein, semiconductor devices and manufacturing techniques are provided in which the strain-inducing effect generated by a contact level formed above a semiconductor region may be increased by using material layers with increased internal stress level, irrespective of the dielectric strength of these materials. It has been recognized that a plurality of materials are available on the basis of well-established PECVD techniques or any other deposition regimes in which higher internal stress levels may be created compared to conventionally used silicon nitride-based materials, which are typically provided in the contact level of sophisticated semiconductor devices. For instance, nitrogen-containing silicon carbide material (SICM) may be formed with a high internal stress level of 4 GPa and significantly higher, wherein the resulting material may, however, exhibit a certain degree of conductivity, which may prevent this material from being applied in accordance with conventional stress liner approaches. Similarly, diamond-like carbon material may also be formed on the basis of well-established deposition techniques with high internal stress levels, thereby also creating a material that may have a certain conductivity. According to the present disclosure, these materials, and any other materials having a high internal stress level without providing sufficient dielectric strength so as to be considered as a dielectric material, may be efficiently incorporated into the contact level of semiconductor devices while nevertheless providing the desired dielectric behavior of the contact level as a whole. For this purpose, an appropriate configuration of the contact level may be provided so as to avoid direct contact with critical areas, such as contact regions, conductive semiconductor areas, contact elements and the like, thereby ensuring the desired dielectric behavior while also enabling a high internal stress level in close proximity to relevant regions, such as channel regions of field effect transistors. Due to the significantly increased internal stress level of these non-insulating materials, an increased performance of circuit elements, such as transistor elements, may be achieved, even for extremely critical surface topography, as may be encountered in densely packed device regions of sophisticated semiconductor devices. Consequently, complex logic circuitry may be formed on the basis of a contact level that may provide superior performance, i.e., for superior performance per power consumed by the device, for instance, in terms of computing power for a given amount of power consumption, when microprocessors are considered.

With reference to FIGS. 2a-2m, further illustrative embodiments will now be described in more detail, wherein reference may also be made to FIG. 1, if appropriate.

Figure 2A:
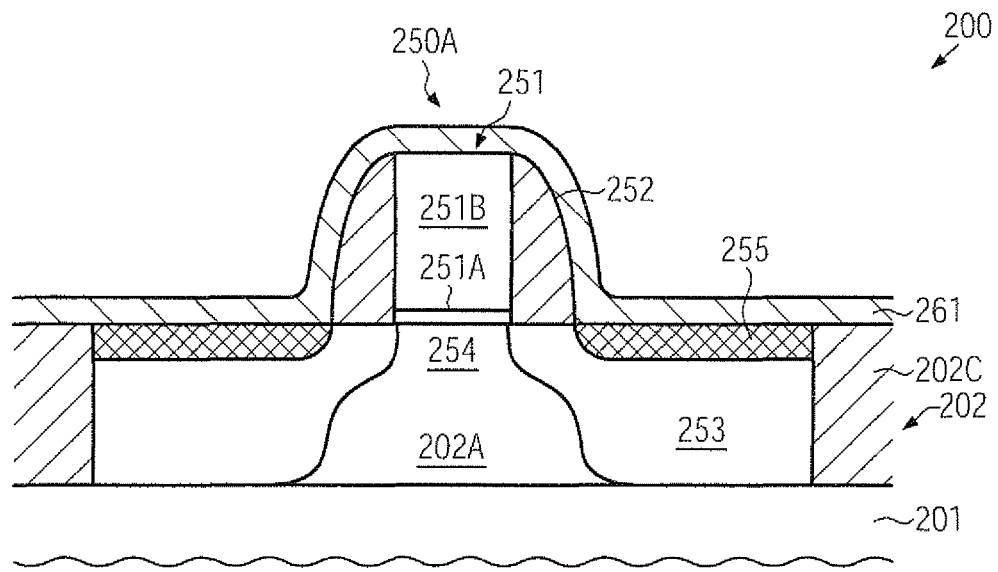
FIGS. 2a-2e schematically illustrate cross-sectional views of a semiconductor device during various manufacturing stages in forming a contact level having a strain-inducing material with high internal stress level while at the same time providing the electrical integrity of the contact level, according to illustrative embodiments.

FIG. 2a schematically illustrates a cross-sectional view of a semiconductor device 200 which may comprise a substrate 201 and a semiconductor layer 202 formed above the substrate 201. The semiconductor layer 202 may represent any appropriate semiconductor material in which a certain strain component may result in a significant increase of charge carrier mobility. For instance, the semiconductor layer 202 may represent a silicon-based material, possibly comprising other components, such as germanium, carbon and the like. Furthermore, the substrate 201 and the semiconductor layer 202 may represent a silicon-on-insulator (SOI) configuration if a buried insulating layer (not shown) is formed between the substrate 201 and the semiconductor layer 202. The semiconductor layer 202 may comprise isolation structures 202C, which may thus also be considered as a part of the semiconductor layer 202, although these structures 202C may be insulating device areas comprised of any appropriate dielectric material, such as silicon dioxide, silicon nitride and the like. The isolation structures 202C may delineate or define in a lateral direction a semiconductor region 202A, which may also be referred to as an active region, if appropriate. An active region is to be understood as any semiconductor region within the layer 202 which may have or receive an appropriate dopant concentration so as to form a PN junction therein. In the embodiment shown, the semiconductor region 202A may represent a portion of a circuit element 250A, which may be provided in the form of a field effect transistor that may comprise a channel region 254 and drain and source regions 253 in combination with metal silicide regions 255, which may be positioned within the active region 202A. Furthermore, the circuit element 250A in the form of a field effect transistor may comprise a gate electrode structure 251, which may comprise a gate dielectric material 251A that separates a gate electrode material 251B from the channel region 254. Additionally, a spacer structure 252 may be formed on sidewalls of the gate electrode structure 251. It should be appreciated that inducing a certain type of strain within the active region 202A and in particular within the channel region 254 may be highly advantageous for field effect transistors, since the charge carrier mobility may be increased within the channel region 254, thereby increasing the drive current capability of the transistor, which may directly translate into superior performance. In other cases, the circuit element 250A may represent any other appropriate circuit element in which a desired strain component may enhance the overall performance of the device 200. Furthermore, in the manufacturing stage shown in FIG. 2a, a dielectric layer 261 may be formed above the transistor 250A, that is, above the metal silicide regions 255, a portion of which may be considered as a contact region for the active region 202A or the transistor 250A, and above the gate electrode structure 251 and the spacer structure 252. Moreover, the layer 261 may be formed on or above the isolation structures 202C. The dielectric layer 261 may represent any appropriate dielectric material, such as silicon dioxide, silicon nitride and the like, which may provide electrically insulating characteristics in view of a non-insulating material to be formed above the dielectric layer 261 in a later manufacturing stage. For instance, the dielectric material 261 may be provided with a thickness of approximately 5-20 nm, depending on the overall device requirements. For example, in view of an efficient strain transfer into the channel region 254, the thickness of the layer 261 may be reduced, which may be accomplished by selecting appropriate material characteristics, such as density and the like, in order to provide the required dielectric strength. In other illustrative embodiments, the dielectric layer 261 may be provided in the form of a highly stressed dielectric material, such as a silicon nitride material and the like, wherein the internal stress level may be appropriate so as to enhance performance of the transistor 250A. As previously explained, internal stress levels of 3.6 GPa of compressive stress may be generated in accordance with presently available PECVD techniques. Similarly, an internal stress level of approximately 1.6 GPa of tensile stress may be applied when the transistor 250A may represent an N-channel transistor in which the tensile strain component may result in an increase of transistor performance. It should be appreciated, however, that any other internal stress level may be selected in order to obtain the desired dielectric strength for a given layer thickness.

The semiconductor device 200 as illustrated in FIG. 2a may be formed on the basis of the following processes. After forming the isolation structure 202C and incorporating appropriate dopant species into the semiconductor region 202A in order to define the basic transistor characteristics, the gate electrode structure 251 may be patterned on the basis of any appropriate process strategy. It should be appreciated that very sophisticated gate electrode structures may be used, for instance, by incorporating high-k dielectric materials, i.e., dielectric materials having a dielectric constant of 10.0 and higher, in combination with metal-containing electrode materials and the like. Thereafter, the drain and source regions 253 may be formed in combination with the spacer structure 252, wherein these process sequences may also include appropriate anneal processes and the like. Thereafter, the metal silicide region 255 may be formed, wherein, depending on the process strategy and the device configuration, a metal silicide may also be formed in the gate electrode structure 251 (not shown). After completing the transistor 250A, the dielectric layer 261, as a first part of a contact level still to be formed, is deposited in any appropriate form, for instance as a substantially stress-neutral dielectric material, a highly stressed dielectric material and the like. For this purpose, plasma enhanced deposition techniques may be applied.

Figure 2B:
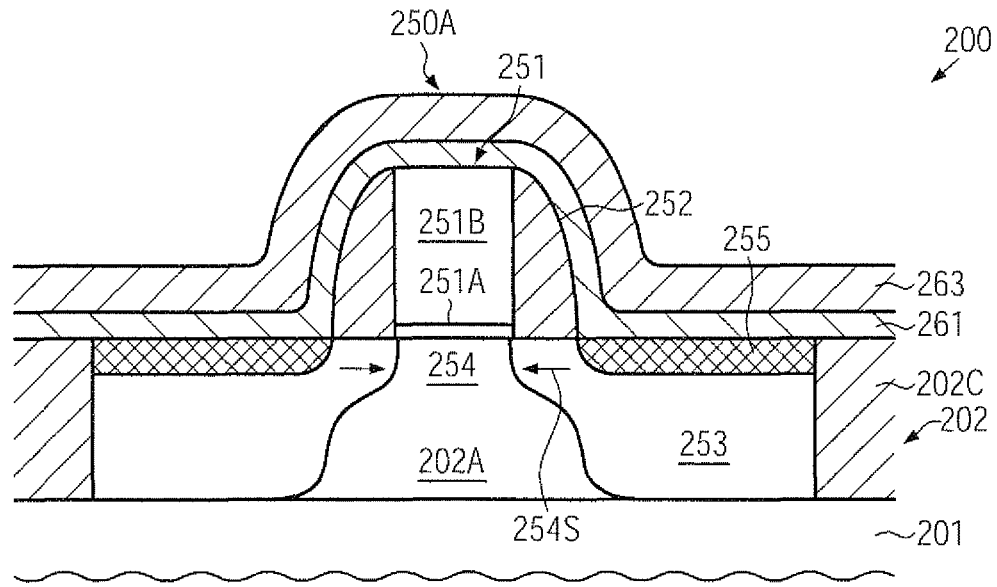

FIG. 2b schematically illustrates the semiconductor device 200 in a state in which a non-insulating strain-inducing material layer 263 may be formed above the transistor 250A. In the embodiment shown, the non-insulating material layer 263 is formed on the dielectric layer 261 so that a direct contact with critical device areas, such as the metal silicide regions 255 and the gate electrode structure 251, is avoided. The material layer 263 may be provided on the basis of any appropriate material composition in order to obtain a high stress level, which, in some illustrative embodiments, is approximately 4 GPa and higher, depending on the material composition and the deposition parameters of a corresponding process recipe. For example, the layer 263 may be provided in the form of an SiCN material, a diamond-like carbon material and the like with a thickness that may be selected such that a desired strain component 254S may be obtained, while also respecting any restrictions in view of deposition related irregularities. That is, due to the increased internal stress level of the layer 263, a thickness thereof may be selected such that the deposition of the layer 263 may be accomplished in a reliable manner, even in densely packed device regions, in which a pronounced surface topography may be encountered. For example, the layer 263 may be provided with a thickness of approximately 20-60 nm, while it should be understood that a greater thickness may also be used if compatible with the device geometry of the semiconductor device 200. Consequently, the material 263 may provide scalability of a strain-inducing mechanism obtained on the basis of a strain-inducing interlayer material.

Figure 2C:
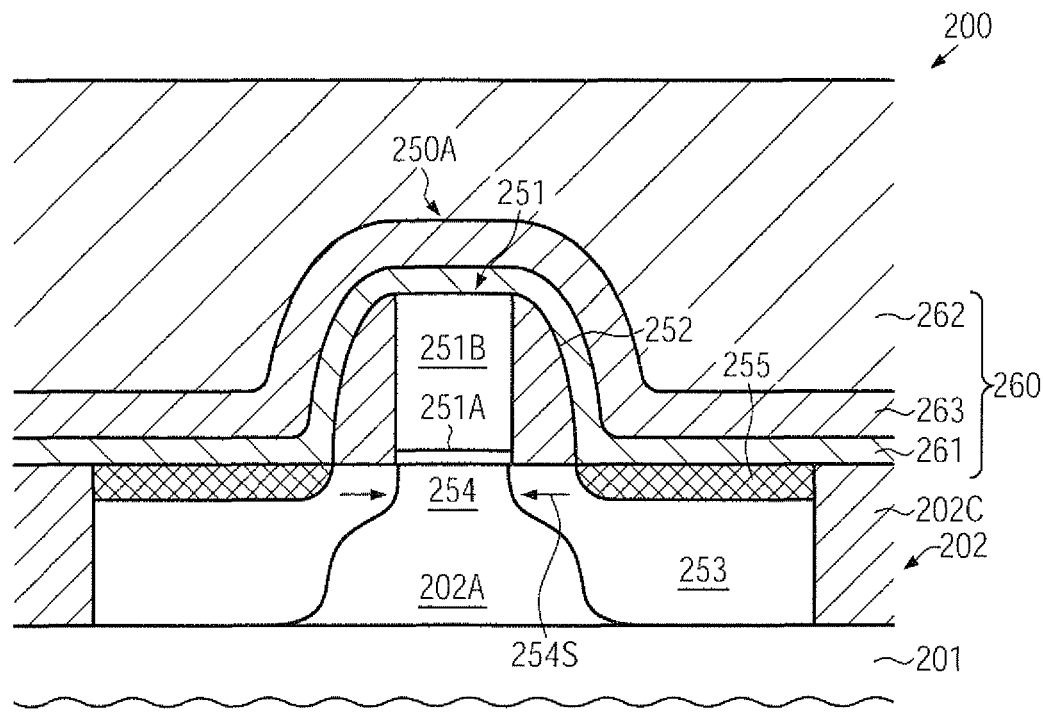

FIG. 2c schematically illustrates the semiconductor device 200 in a further advanced manufacturing stage, in which a further dielectric material 262, such as a silicon dioxide material and the like, may be provided so as to form a contact level 260, which may comprise the materials 261, 263 and 262 as "interlayer materials," wherein the materials 262 and 261 may represent interlayer dielectric materials since these materials may reliably enclose the non-insulating material 263. It should be appreciated that additional materials may be provided in the contact level 260, if considered appropriate. The dielectric material 262 may be formed on the basis of any appropriate deposition technique, such as sub-atmospheric chemical vapor deposition (SACVD), PECVD and the like. After depositing the dielectric material 262, the resulting surface topography may be planarized, if required. For this purpose, any appropriate planarization techniques, such as chemical mechanical polishing (CMP) and the like may be applied.

Figure 2D:
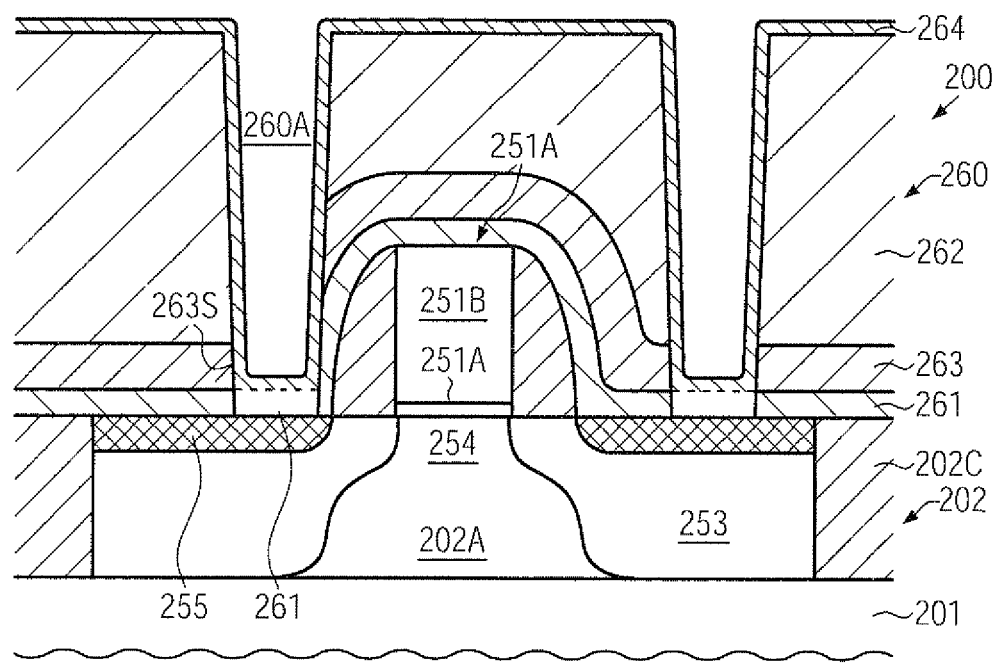

FIG. 2d schematically illustrates the semiconductor device 200 with contact openings 260A formed in the contact level 260, wherein, in the manufacturing stage shown, the contact openings 260A may extend through the dielectric material 262 and through the non-insulating layer 263. In some illustrative embodiments, as indicated by the dashed line, the dielectric material 261 may still be present at the bottom of the contact opening 260A. In other cases, the material of the layer 261 may have been removed at the bottom of the opening 260A during the preceding process sequence. Moreover, an insulating liner material 264 may be formed on surface areas of the opening 260A and on the dielectric material 262.

The contact openings 260A may be formed on the basis of any well-approved patterning strategy, for instance by providing an etch mask, such as a resist mask, a hard mask and the like, in order to define the lateral position and size of the contact openings 260A. It should be appreciated that the lateral size may be selected so as to compensate for the layer thickness of the material 264, if required. Thereafter, appropriate etch recipes may be applied to etch through the material 262, wherein the layer 263 may be used as an etch stop material if this material has sufficient etch resistivity with respect to the etch chemistry for removing the material of the layer 262. In other cases, when the difference in removal rate between the materials 262 and 263 is less pronounced, the dielectric layer 261 may act as an etch stop material, for instance by providing a silicon nitride material. In other illustrative embodiments (not shown), an additional etch stop liner may be formed on the non-insulating layer 263, for instance in the form of a stress-neutral or a highly stressed material, such as a silicon nitride material, thereby also providing a reliable etch stop material in order to efficiently control the etch process. Thereafter, the etch chemistry may be appropriately adapted to etch through the material 263, while using the material 261 as an etch stop material. In other cases, the metal silicide 255 may act as an etch stop, depending on the overall process strategy. In the embodiment illustrated in dashed lines, the material 261 within the opening 260A may be substantially maintained after etching through the non-insulating layer 263, thereby preserving integrity of the metal silicide region 255. Thereafter, the insulating liner material 264 may be deposited, for instance, in the form of a silicon dioxide material, a silicon nitride material and the like, with a thickness that reliably covers sidewall portions 263S of the material 263 in order to maintain electrical integrity of the interlayer material 260. For example, the liner material 264 may be provided with a thickness of approximately 5-15 nm, while other materials may also be selected in accordance with device requirements. Next, the liner material 264 may be selectively removed from the bottom of the opening 260A, which may be accomplished by any anisotropic etch process, for which a plurality of process recipes are available, for instance for removing silicon dioxide material selectively to the metal silicide region 255 or selectively to the material 261, if still present. In other cases, during the corresponding anisotropic etch process, the material 261 may also be removed, if still present. It should be appreciated that during the removal of the liner 264 at the bottom of the opening 260A, the sidewall surface 263S may still remain covered due to the very reduced lateral etch rate in the anisotropic etch process. In other illustrative embodiments, ion sputtering may be applied so as to efficiently remove the material 264 from the bottom of the opening 260A, while additionally providing a certain material redistribution, thereby reliably covering the sidewall surface 263S. In still other illustrative embodiments, the material 264 may be removed from the bottom of the opening 260A in an initial phase of a process sequence for depositing a conductive barrier material, such as titanium, titanium nitride and the like, as may be typically used in combination with a tungsten material, which is typically provided on the basis of a CVD process, thereby requiring a barrier material for maintaining integrity of silicon oxide-based materials. Consequently, prior to deposition, typically a sputter deposition, the material 264 may also be efficiently removed while nevertheless maintaining integrity at the sidewall surface 263S. Consequently, after removing the material 264 from the bottom of the opening 260A, the opening 260A may connect to the metal silicide region 255, which may thus represent a contact region of the transistor 250A. Thereafter, the opening 260A may be filled with a conductive material, such as tungsten and the like, possibly in combination with one or more appropriate barrier materials, as discussed above. Next, any excess materials may be removed, for instance by CMP and the like.

Figure 2E:
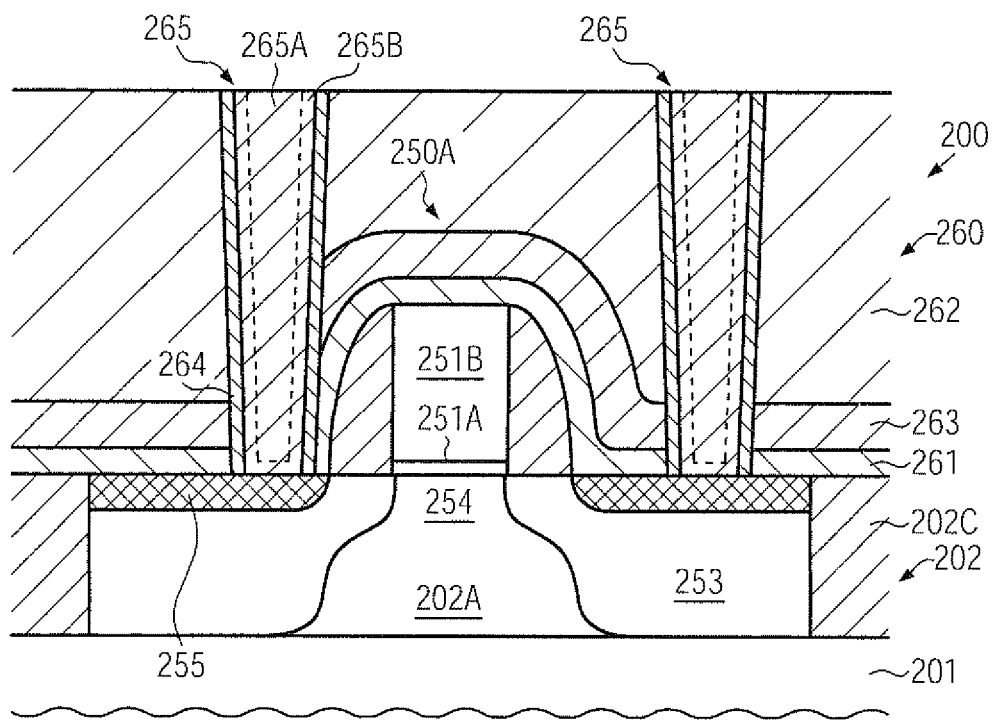

FIG. 2e schematically illustrates the semiconductor device 200 with contact elements 265 formed in the interlayer material 260 and connecting to the metal silicide regions 255, wherein the contact elements 265 may be formed in accordance with the above-described process sequence. Hence, the contact elements 265 may comprise a conductive core material 265A, such as tungsten and the like, in combination with a conductive barrier material 265B, which in turn may contain one or more different material compositions, such as titanium, titanium nitride and the like. Furthermore, the contact elements 265 are electrically insulated from the non-insulating material layer 263 such that interlayer material 260 may provide the electrical integrity of the device 200 while at the same time providing superior strain conditions in the active region 202A.

Figure 2F:
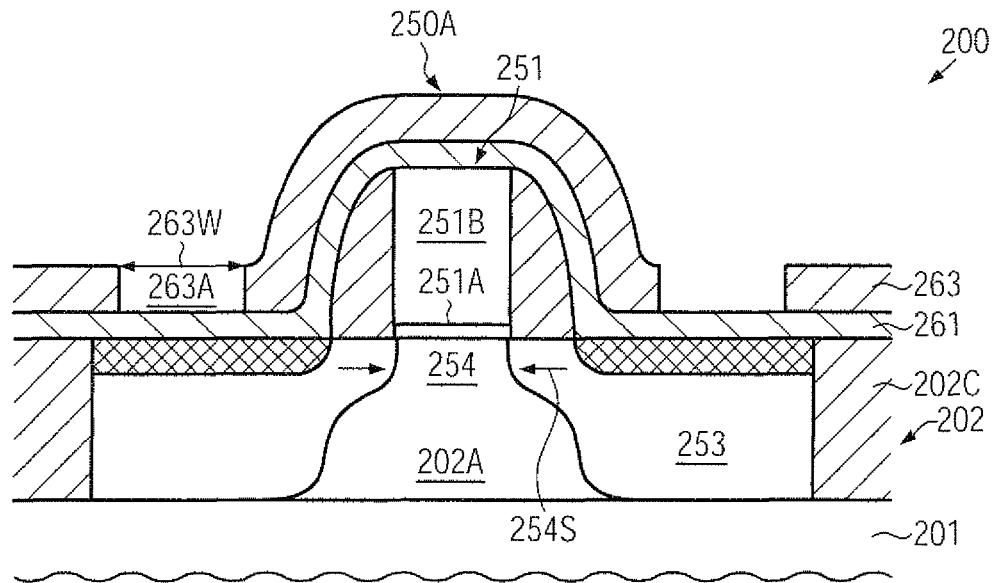
FIGS. 2f-2g schematically illustrate cross-sectional views of the semiconductor device according to a process strategy in which an opening may be formed through a non-insulating material layer in the contact level prior to depositing a final interlayer dielectric material, according to illustrative embodiments.

FIG. 2*f* schematically illustrates the semiconductor device 200 according to further illustrative embodiments. As illustrated, the non-insulating material 263 is formed on or above the dielectric material 261 and may comprise openings 263A, whose lateral position and size is to be adapted to the lateral position and size of contact elements still to be formed. That is, a lateral size, indicated by a width 263W, may be greater than the lateral size of contact elements, at least at the height level corresponding to the material layer 263. The openings 263A may be formed on the basis of appropriate lithography techniques using an appropriate mask, such as a resist mask, wherein, additionally, a planarization material, such as a polymer material, a resist material, may be applied if the surface topography of the device 200 is considered inappropriate. It should be appreciated, however, that the patterning of the material layer 263 may be less critical due to the moderately low thickness thereof. Furthermore, during the patterning of the opening 263A, the material 261 may act as an efficient etch stop material.

Figure 2G:
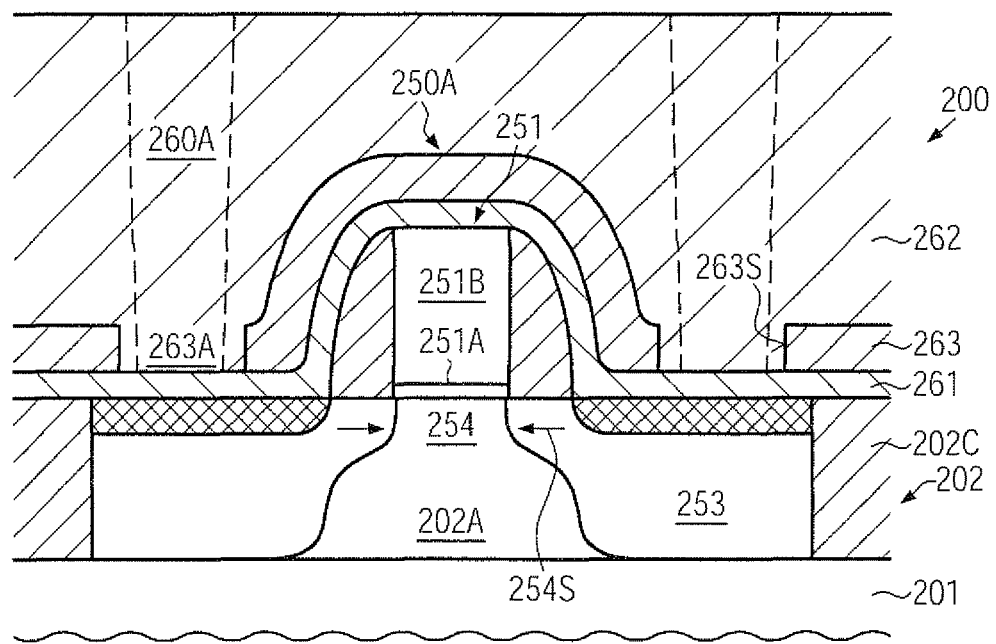

FIG. 2*g* schematically illustrates the semiconductor device 200 in a further advanced manufacturing stage in which the material 262 may be formed above the layer 263 and, in the embodiment shown, may be formed within the opening 263A. In other illustrative embodiments, as will be described later on, prior to depositing the material 262, an additional deposition step is performed so as to reliably fill the opening 263A, thereby also encapsulating the sidewall surfaces 263S. In other cases, the gap filling capabilities for providing the material 262, or at least a portion thereof, may be appropriate for reliably filling the opening 263A. For instance, SACVD techniques may provide superior gap filling behavior. Thereafter, the contact opening 260A may be formed on the basis of process techniques, as described above, wherein, as illustrated, the lateral size of the opening 260A may be less compared to the opening 263A, thereby providing dielectric material between the sidewall 263S and the opening 260A, which may thus result in a reliable electrical insulation of the material 263 with respect to the opening 260A and the contact element to be formed therein. Consequently, after forming the contact opening 260A, a conductive metal may be filled in without requiring the deposition of an additional liner material. Furthermore, during the patterning of the contact opening 260A, the dielectric material 261 may act as an etch stop material. In other cases, an additional dielectric material may be formed within the opening 263A, which may also be used as an efficient etch stop material.

Figure 2H:
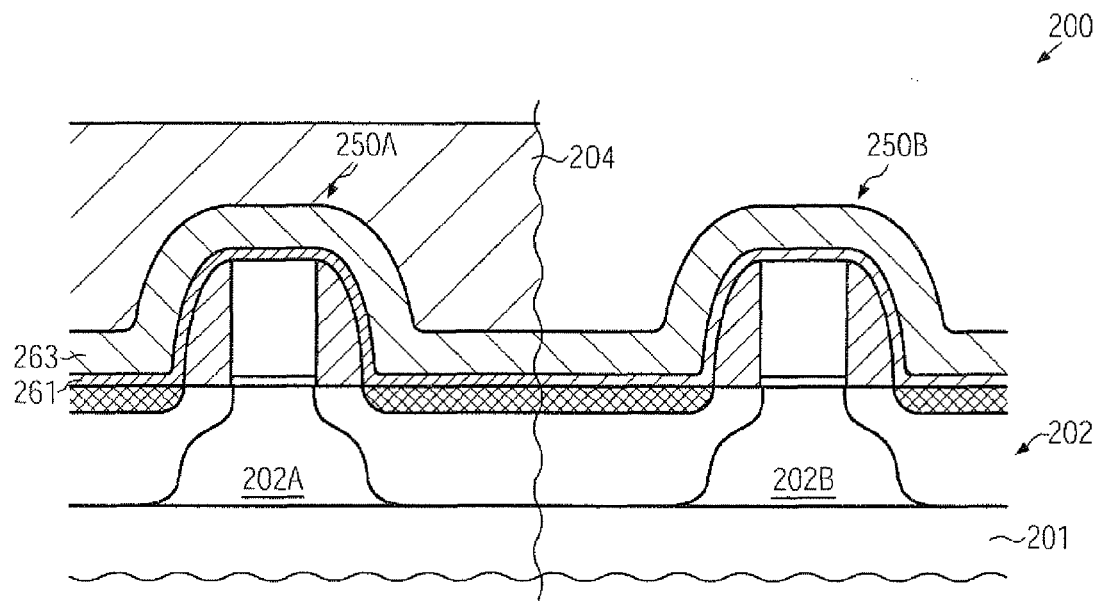
FIGS. 2h-2i schematically illustrate cross-sectional views of the semiconductor device in which a non-insulating stressed material layer may be formed with different internal stress levels above corresponding circuit elements, according to further illustrative embodiments.

FIG. 2*h* schematically illustrates the semiconductor device 200 according to further illustrative embodiments in which a second transistor 250B may be formed in and above a second active region 202B, wherein the transistor 250B may require a different type of strain in order to enhance performance thereof. Furthermore, in the manufacturing stage shown, the dielectric layer 261 and the non-insulating material layer 263 may be formed above the transistors 250A, 250B. Additionally, an etch mask 204 may be provided so as to expose the transistor 250B, i.e., the portion of the layer 263 formed above the transistor 250B. In the embodiment shown, it may be assumed that the internal stress level of the layer 263 may be appropriate for enhancing performance of the transistor 250A, as is also previously explained. On the other hand, the internal stress level of the layer 263 may deteriorate performance of the transistor 250B. Consequently, the layer 263 may be removed from above the transistor 250B, which may be accomplished on the basis of any appropriate etch recipe, for instance using wet chemical process steps in combination with the etch mask 204, wherein the material 261 may act as an efficient etch stop material.

Figure 2I:
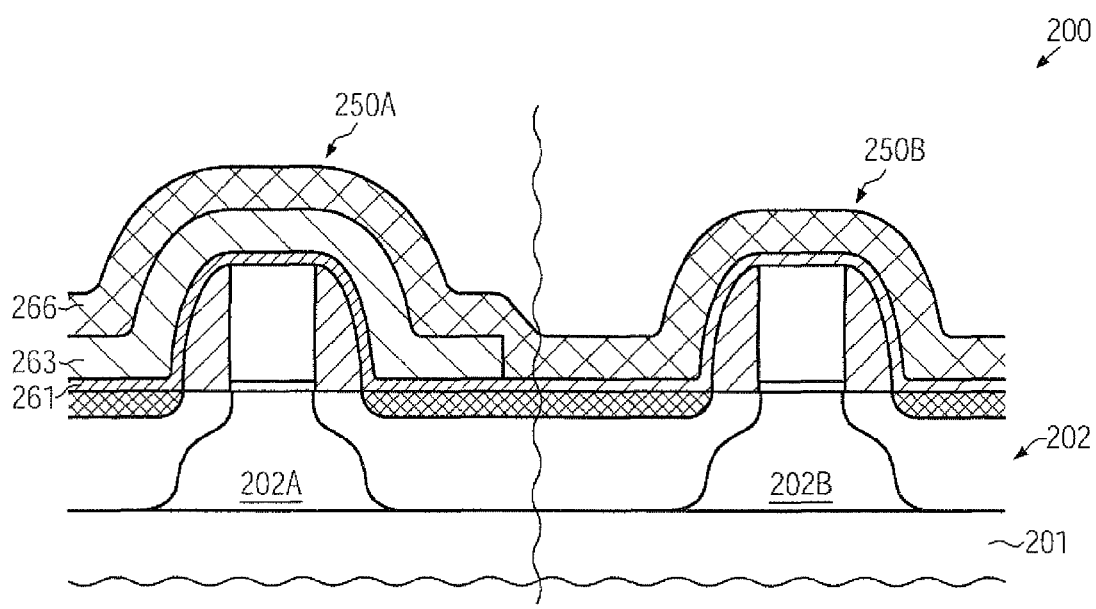

FIG. 2*i* schematically illustrates the semiconductor device 200 in a further advanced manufacturing stage, i.e., after removing the layer 263 selectively from above the transistor 250B and removing the etch mask 204 shown in FIG. 2*h*. Furthermore, a further strain-inducing material layer 266, which may represent a dielectric material or a non-insulating material, may be provided above the transistors 250A, 250B, which may be accomplished on the basis of any appropriate deposition technique. It should be appreciated that, due to the moderately low thickness of the layer 263, less sophisticated surface conditions may be encountered during the deposition of the material 266, so that a moderately high strain level may be obtained in the transistor 250B, even if the material has to be provided as a dielectric material with a reduced internal stress level, since a moderately great layer thickness may be applied. In other cases, the layer 266 may be provided in the form of a conductive material, such as a metal and the like, depending on the type and magnitude of strain required. Thereafter, the further processing may be continued on the basis of process strategies, as discussed above, when the presence of the layer 266 above the transistor 250A is considered appropriate. In other cases, the layer 266 may be removed, for instance, by forming an appropriate etch mask so as to cover the transistor 250B and thereafter the further processing may be continued as described above. In still other illustrative embodiments, the stress level of the layer 266 may be selectively reduced above the transistor 250A, for instance by ion bombardment and the like, wherein the transistor 250B may be masked.

Figure 2J:
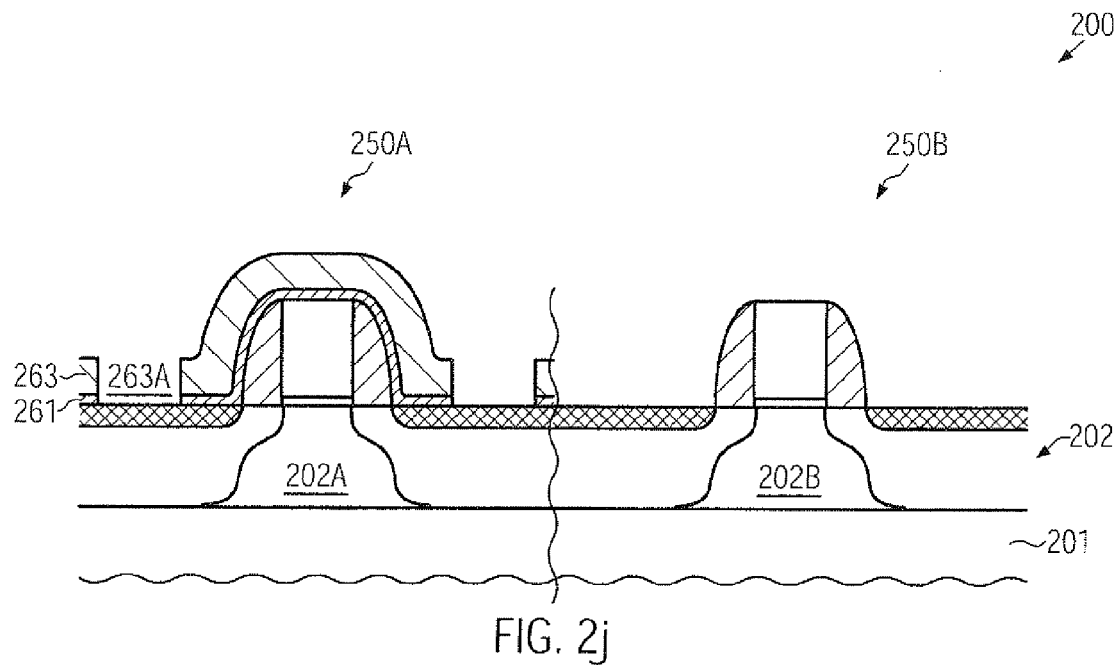
FIGS. 2j-2m schematically illustrate cross-sectional views of the semiconductor device according to still further illustrative embodiments in which non-insulating stressed dielectric materials of different internal stress levels may be formed without requiring an insulating liner material in corresponding contact openings.

FIG. 2*j* schematically illustrates the semiconductor device 200 according to further illustrative embodiments. As illustrated, the material layer 263 is selectively formed above the transistor 250A, while the transistor 250B may be substantially exposed. That is, in the embodiment shown, the dielectric layer 261 may have been removed from the transistor 250B, if the presence thereof is considered disadvantageous for the transistor 250B. For example, the dielectric material 261 may be provided with a high internal stress level that induces the same type of strain as the material 263. In other cases, when the layer 261 is a substantially stress-neutral layer, the removal thereof from the transistor 250B may be omitted.

The semiconductor device 200 as shown in FIG. 2*j* may be formed on the basis of similar process techniques as previously described, i.e., the layers 261 and 263 may be deposited above the transistors 250A, 250B and subsequently the layer 263 may be selectively removed from above the transistor 250B, as is for instance also described with reference to FIG. 2*h*, while, additionally, during the same etch process, the openings 263A may also be formed by appropriately adapting the corresponding etch mask.

Figure 2K:
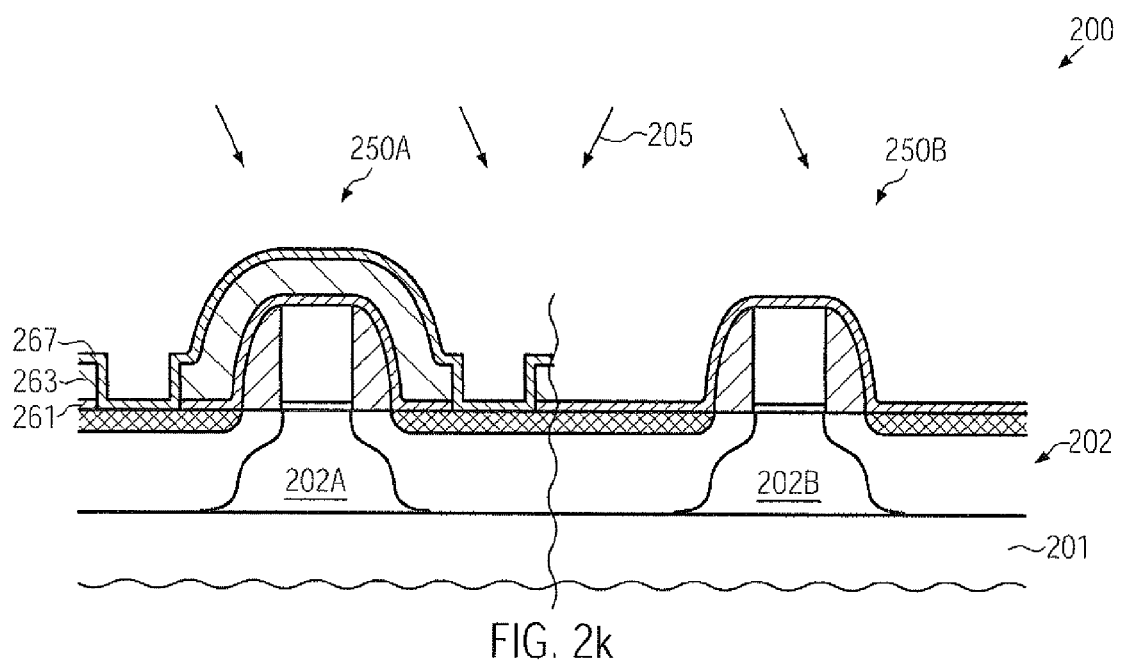

FIG. 2*k* schematically illustrates the semiconductor device 200 when exposed to a deposition ambient 205, in which a dielectric layer 267 may be deposited, such as a silicon dioxide layer, a silicon nitride layer and the like, which may have a high internal stress level so as to enhance performance of the transistor 250B, or which may represent a substantially stress-neutral material.

Figure 2L:
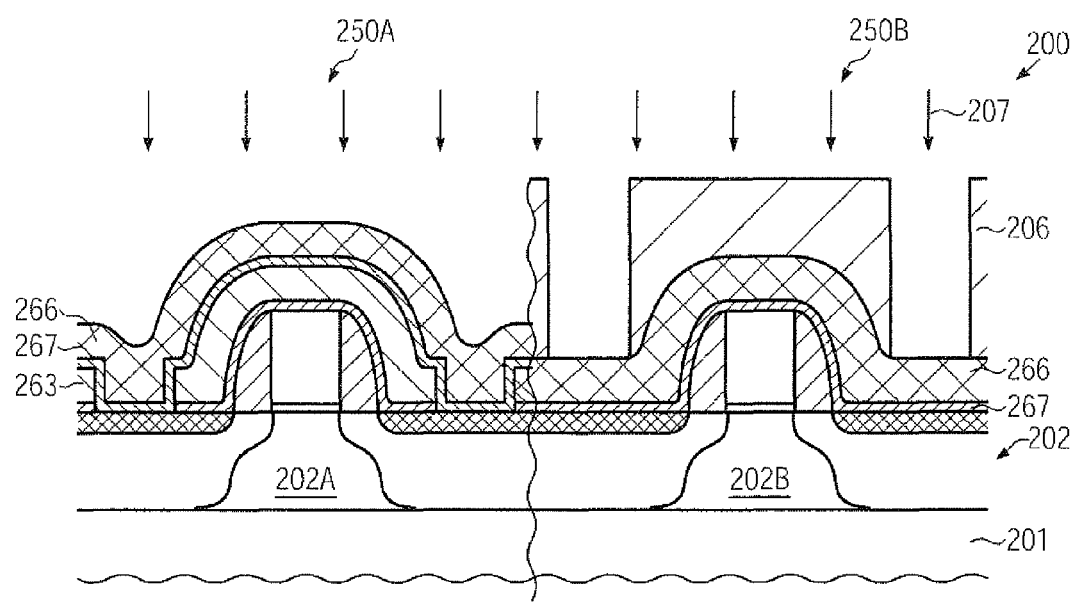

FIG. 2*l* schematically illustrates the semiconductor device 200 in a further advanced manufacturing stage in which the further strain-inducing material 266, which in one illustrative embodiment may be provided as a non-insulating material, may be formed above the first and second transistors 250A, 250B, with the dielectric material 267 providing electrical integrity. Furthermore, an etch mask 206 may be provided so as to expose the transistor 250A and also expose portions of the transistor 250B, in which contact openings in the layer 266 may have to be provided in a later manufacturing stage.

With respect to any process techniques for forming the material 266 and the etch mask 206, the same criteria may apply as previously explained. Based on the etch mask 206, the device 200 is exposed to an etch process 207 for removing the material of the layer 266 selectively with respect to the dielectric material 267. Consequently, the material 266 may be efficiently removed from above the transistor 250A while at the same time corresponding openings may be formed in the material 266 in the transistor 250B.

Figure 2M:
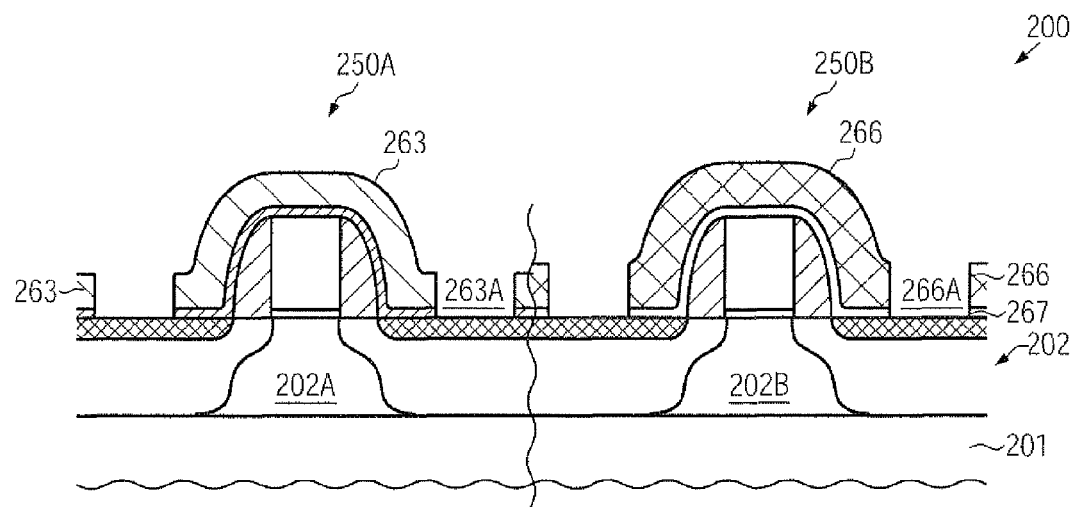

FIG. 2m schematically illustrates the semiconductor device 200 in a manufacturing stage in which the layer 263 is formed above the transistor 250A and may comprise the openings 263A, while the layer 266 may be formed above the transistor 250B and may comprise openings 266A formed during the preceding etch process 207 (FIG. 2l). It should be appreciated that the dielectric material 267 may also be removed in the transistor 250A and within the openings 266A, if desired, so that the openings 263A may connect to the metal silicide regions 255, while in other cases the layer 267 may be preserved if desired. Thereafter, the further processing may be continued, for instance, by depositing a further dielectric material and patterning the same so as to form contact openings to extend through the openings 263A, 266A without requiring an additional liner material for appropriately insulating the materials 263 and 266, as is also explained with reference to FIGS. 2f and 2g.

As a result, the present disclosure provides devices and manufacturing techniques in which non-insulating materials may be provided in the contact level, such as SiCN, diamond-like materials, metals and the like, and which may enable an increased strain level in semiconductor regions, such as active regions of transistors, and a moderately low layer thickness. In some illustrative embodiments, a very efficient overall process flow may be provided wherein non-insulating materials of different internal stress levels may be applied above different semiconductor regions in order to obtain a "dual stress liner" approach on the basis of highly stressed conductive materials.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
    forming a first dielectric layer above a semiconductor region comprising a contact region;
    forming a non-insulating strain-inducing material layer above said first dielectric layer;
    forming an offset opening having a first lateral size in said non-insulating strain-inducing material layer and above said contact region;
    forming a second dielectric layer inside of said offset opening and above said non-insulating strain-inducing material layer during a common material deposition process, said second dielectric layer completely filling said offset opening;
    forming a contact opening so as to extend from said second dielectric layer above said non-insulating strain-inducing material layer and through said filled offset opening to said contact region, wherein said contact opening has a second lateral size that is less than said first lateral size and sidewalls of said contact opening are laterally separated from sidewalls of said filled offset opening; and
    filling said contact opening with a conductive material.

2. The method of claim 1, wherein forming said contact opening comprises forming an opening through at least said second dielectric layer and said non-insulating strain-inducing material layer and forming a dielectric liner material in said opening.

3. The method of claim 2, further comprising removing a portion of said dielectric liner material at a bottom of said opening by an anisotropic removal process.

4. The method of claim 1, wherein said first dielectric layer is formed with an internal stress level and wherein said first dielectric layer and said non-insulating strain-inducing material layer induce the same type of strain in said semiconductor region.

5. The method of claim 4, wherein said first dielectric layer is formed with a thickness of approximately 20 nm or less.

6. The method of claim 1, further comprising forming a second non-insulating strain-inducing material layer above a second semiconductor region, wherein said second non-insulating strain-inducing material layer induces a different type strain in said second semiconductor region compared to a strain induced in said semiconductor region by said non-insulating strain-inducing material layer.

7. The method of claim 6, wherein forming said second non-insulating strain-inducing material layer comprises forming said non-insulating strain-inducing material layer above said semiconductor region and said second semiconductor region, removing said non-insulating strain-inducing material layer selectively from above said second semiconductor region and forming said second non-insulating strain-inducing material layer above said non-insulating strain-inducing material layer and said second semiconductor region.

8. The method of claim 7, further comprising removing said second non-insulating strain-inducing material layer selectively from above said semiconductor region.

9. A method, comprising:
    forming a non-insulating strain-inducing material layer above a semiconductor region of a semiconductor device so as to be electrically insulated from said semiconductor region, said non-insulating strain-inducing material layer inducing strain in said semiconductor region;
    forming a first opening in said non-insulating strain-inducing material layer;
    forming a dielectric material inside of said first opening and above said non-insulating strain-inducing material layer during a common material deposition process, said dielectric material completely filling said first opening;
    forming a second opening in said dielectric material, said second opening extending through said filled first opening in said non-insulating strain-inducing material layer and having a lateral size that is less than a lateral size of said first opening; and
    forming a contact element in said second opening, said contact element being electrically insulated from said non-insulating strain-inducing material layer.

10. The method of claim 9, further comprising forming a transistor element in and above said semiconductor region prior to forming said non-insulating strain-inducing material layer.

11. The method of claim 9, further comprising forming a dielectric layer above said semiconductor region and forming said non-insulating strain-inducing material layer on said dielectric layer.

12. The method of claim 1, wherein at least said second dielectric material layer electrically insulates said conductive material in said contact opening from said non-insulating strain-inducing material layer.

13. A method, comprising:
   forming a first non-insulating strain-inducing material layer above a first transistor element of a semiconductor device, wherein said first non-insulating strain-inducing material layer is electrically insulated from and induces a first type of strain in said first transistor element;
   forming a second non-insulating strain-inducing material layer above a second transistor element of said semiconductor device, wherein said second non-insulating strain-inducing material layer is electrically insulated from and induces a second type of strain in said second transistor element, said second type of strain being different than said first type of strain;
   performing a common deposition process to form a dielectric material above said first and second non-insulating strain-inducing material layers and inside of an opening formed in at least one of said first and second non-insulating strain-inducing material layers, said dielectric material completely filling said opening; and
   forming a contact element through said dielectric material and through said opening formed in said at least said one of said first and second non-insulating strain-inducing material layers, said contact element being electrically isolated from said at least said one of said first and second non-insulating strain-inducing material layers by said dielectric material formed in said opening.

14. The method of claim 13, wherein forming said second non-insulating strain-inducing material layer comprises forming said first non-insulating strain-inducing material layer above said first and second transistor elements, selectively removing said first non-insulating strain-inducing material layer from above said second transistor element, and forming said second non-insulating strain-inducing material layer above said first non-insulating strain-inducing material layer and said second transistor element.

15. The method of claim 14, further comprising removing said second non-insulating strain-inducing material layer from above said first non-insulating strain-inducing material layer prior to forming said dielectric material.

16. The method of claim 13, further comprising forming a first dielectric layer above said first transistor element prior to forming said first non-insulating strain-inducing material layer and forming a second dielectric layer above said second transistor element prior to forming said second non-insulating strain-inducing material layer, said first dielectric layer electrically insulating said first non-insulating strain-inducing material layer from said first transistor element and said second dielectric layer electrically insulating said second non-insulating strain-inducing material layer from said second transistor element.

17. The method of claim 13, further comprising forming a second opening at least through another one of said first and second non-insulating strain-inducing material layers, forming a dielectric liner on exposed sidewalls of said second opening, and thereafter forming said contact element at least in said second opening, wherein at least said dielectric liner electrically insulates said contact element from said another one of said first and second non-insulating strain-inducing material layers.

18. The method of claim 13, further comprising forming a second opening in said dielectric material so as to extend through said first opening to a contact region therebelow and forming said contact element in said second opening, wherein at least said dielectric material electrically insulates said contact element from said one of said first and second non-insulating strain-inducing material layers.

\* \* \* \* \*